(12) United States Patent
Singh

(10) Patent No.: US 7,628,865 B2
(45) Date of Patent: Dec. 8, 2009

(54) METHODS TO CLEAN A SURFACE, A DEVICE MANUFACTURING METHOD, A CLEANING ASSEMBLY, CLEANING APPARATUS, AND LITHOGRAPHIC APPARATUS

(75) Inventor: Mandeep Singh, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 374 days.

(21) Appl. No.: 11/413,216

(22) Filed: Apr. 28, 2006

(65) Prior Publication Data

US 2007/0251543 A1   Nov. 1, 2007

(51) Int. Cl.
*B08B 3/12* (2006.01)
*A61N 5/00* (2006.01)
*G21G 5/00* (2006.01)
*H01L 21/00* (2006.01)

(52) U.S. Cl. .................. 134/1; 250/492.1; 438/115
(58) Field of Classification Search .................. 438/115; 250/492.1; 134/1
See application file for complete search history.

(56) References Cited

U.S. PATENT DOCUMENTS

| 6,858,833 | B2 | 2/2005 | Curtis et al. | |
| 6,943,062 | B2 * | 9/2005 | Chen et al. | 438/115 |
| 2002/0115164 | A1 | 8/2002 | Wang et al. | |
| 2004/0256542 | A1 | 12/2004 | Okazaki | 250/227.11 |
| 2006/0077361 | A1 | 4/2006 | Sogard | |
| 2006/0086371 | A1 | 4/2006 | Ohkubo et al. | |

FOREIGN PATENT DOCUMENTS

KR    10-0433174 B    5/2004
WO    WO 2004/113993 A1    12/2004
WO    WO 2005/096115 A1    10/2005

OTHER PUBLICATIONS

Dholakia et al., "Optical Micromanipulation Takes Hold", NanoToday, Feb. 2006, vol. 1, No. 1, 10 pgs (Elsevier).
Molloy et al., "Lights, Action: Optical Tweezers", Contemporary Physics, 2002, vol. 43, No. 4, pp. 241-258 (Taylor & Francis Ltd).
Dholakia et al., "Optical Tweezers: the Next Generation", Physics: Quantum Games Strategies and Superpositions, vol. 15, No. 10, Oct. 2002, pp. 31-35.
Lee et al., "Optical Steering of High and Low Index Microparticles by Manipulating an Off-Axis Optical Vortex", Journal of Optics A: Pure and Applied Optics, 7, Nov. 19, 2004, 6 pgs (IOP Publishing Ltd).

(Continued)

*Primary Examiner*—Evan Pert
*Assistant Examiner*—Monica D Harrison
(74) *Attorney, Agent, or Firm*—Sterne, Kessler, Goldstein & Fox P.L.L.C.

(57) ABSTRACT

An embodiment of the invention provides a method to clean a surface. The method includes at least partly liberating contaminants from the surface with a contaminant liberating device, and capturing the contaminants that have been at least partly liberated with a contaminant removal device, the contaminant removal device generating at least one optical trap to trap the contaminants that have been at least partly liberated. Embodiments of the invention also provide a device manufacturing method, a method to clean a surface of an optical element, a cleaning assembly and cleaning apparatus, and a lithographic apparatus.

38 Claims, 3 Drawing Sheets

OTHER PUBLICATIONS

McGloin et al., "Bessel Beams: Diffraction in a New Light", Contemporary Physics, vol. 46, No. 1, Feb. 16, 2004, pp. 15-28 (Taylor & Francis Ltd).

Garces-Chavez et al., "Optical Levitation in a Bessel Light Beam", Applied Physics Letters, vol. 85, No. 18, Nov. 1, 2004, pp. 4001-4003.

Volke-Sepulveda et al., "Orbital Angular Momentum of a High Order Bessel Light Beam", J. Opt. B: Quantum Semiclass. Opt. 4, S82, pp. 223-224 (2002).

European Search Report and Written Opinion mailed Jun. 17, 2009 for European Application No. 07106245.9 - 1226 / 1850182, 6 pgs.

* cited by examiner

METHODS TO CLEAN A SURFACE, A DEVICE MANUFACTURING METHOD, A CLEANING ASSEMBLY, CLEANING APPARATUS, AND LITHOGRAPHIC APPARATUS

FIELD

The present invention relates to surface cleaning methods, a device manufacturing method, a cleaning assembly, cleaning apparatus, and lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising one, part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Although lithographic apparatus are usually operated in clean rooms, and often flushed with clean air, contamination of the apparatus does occur and, depending on the location and type of contaminant, causes various problems. For example, inorganic contaminants on the mask deriving from the air in the clean room or from manufacture, transportation and storage of the mask can cause localized absorption of the projection beam leading to dose errors and improper imaging of mask features or even printing of marks in what should be blank areas. Particulates on the substrate table can distort the substrate leading to localized focus errors known as hot spots. In addition to the ambient air and the manufacture, etc. of masks and substrates, sources of contamination include resist debris sputtered from the substrate by the projection beam during exposures and mechanical contact between moving parts of the apparatus, which may cause particulates to be dislodged from the contacting surfaces.

To minimize errors caused by contamination, susceptible parts of the apparatus, such as masks, mask tables and substrate tables, optics, are cleaned periodically, for example manually. This generally is a time-consuming task, taking two hours or more to clean a substrate table, for example, which causes undesirable downtime of the apparatus and must be carried out by skilled engineers.

SUMMARY

It is desirable to improve cleaning, for example, in the lithographic apparatus and/or lithographic method. It is also desirable to remove contamination from certain surfaces and/or objects in a simple and efficient manner.

According to an embodiment, there is provided a method to clean a surface, the method comprising: providing a contaminant liberating device constructed and arranged to at least partly liberate contaminants from the surface which is to be cleaned; and providing a contaminant removal device constructed and arranged to capture contaminants, wherein the contaminant removal device generates at least one optical trap to trap contaminants, at least partly liberated by the liberating device.

According to an embodiment, a method to clean a surface is provided. The method includes at least partly liberating contaminants from the surface with a contaminant liberating device; and capturing the contaminants that have been at least partly liberated with a contaminant removal device, the contaminant removal device generating at least one optical trap to trap the contaminants that have been at least partly liberated.

Also, according to an embodiment, there is provided a method to clean a surface, the method comprising: moving at least one optical trap along the surface to at least partly liberate and/or capture contaminant particles without knowing positional coordinates of such particles.

In addition, an embodiment provides a device manufacturing method, comprising: transferring a pattern from a patterning device onto a substrate, wherein the method includes generating at least one optical trap to optically liberate, trap and/or capture particles.

Another embodiment provides a method to clean a surface of an optical element, the method comprising: using at least one optical trap to at least partly liberate and/or capture contaminant particles, present on the surface of the optical element.

Yet another embodiment provides an assembly for cleaning a surface, the assembly comprising: at least one contaminant liberating device constructed and arranged to at least partly liberate contaminants from the surface to be cleaned; and at least one particle trapping apparatus being configured to generate at least one optical trap.

Also, an embodiment provides a cleaning apparatus, the apparatus being configured to generate at least one optical trap, and to move the at least one optical trap and the surface with respect to each other, to at least partly liberate and/or capture one or more contaminant particles that may be present on the surface, without having obtained and/or obtaining positional coordinates of such particles prior to liberating and/or capture respective particles.

According to another embodiment, there is provided a cleaning apparatus, for cleaning a surface, the apparatus being configured to generate at least one optical trap, and to move at least one optical trap along the surface, such that the at least one optical trap reaches substantially each part of the surface within a certain cleaning period, and such that the at least one trap can encounter one or more contaminant particles that may be present on the surface.

According to an embodiment, an assembly comprises at least an optical element, as well as a particle trapping apparatus being configured to generate at least one optical trap, the assembly being configured such that the particle trapping apparatus can clean at least part of the optical element using the optical trap.

In an embodiment, there is provided a lithographic apparatus arranged to transfer a pattern from a patterning device onto a substrate, the apparatus comprising at least one optical trap generator configured to generate at least one optical trap for liberating and/or capturing particles in the lithographic apparatus.

In an other embodiment, there is provided a lithographic apparatus arranged to transfer a pattern from a patterning device onto a substrate, the apparatus comprising at least one assembly comprising: at least one contaminant liberating device constructed and arranged to be at least partly liberate contaminants from the surface to be cleaned; and at least one particle trapping apparatus being configured to generate at least one optical trap.

DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
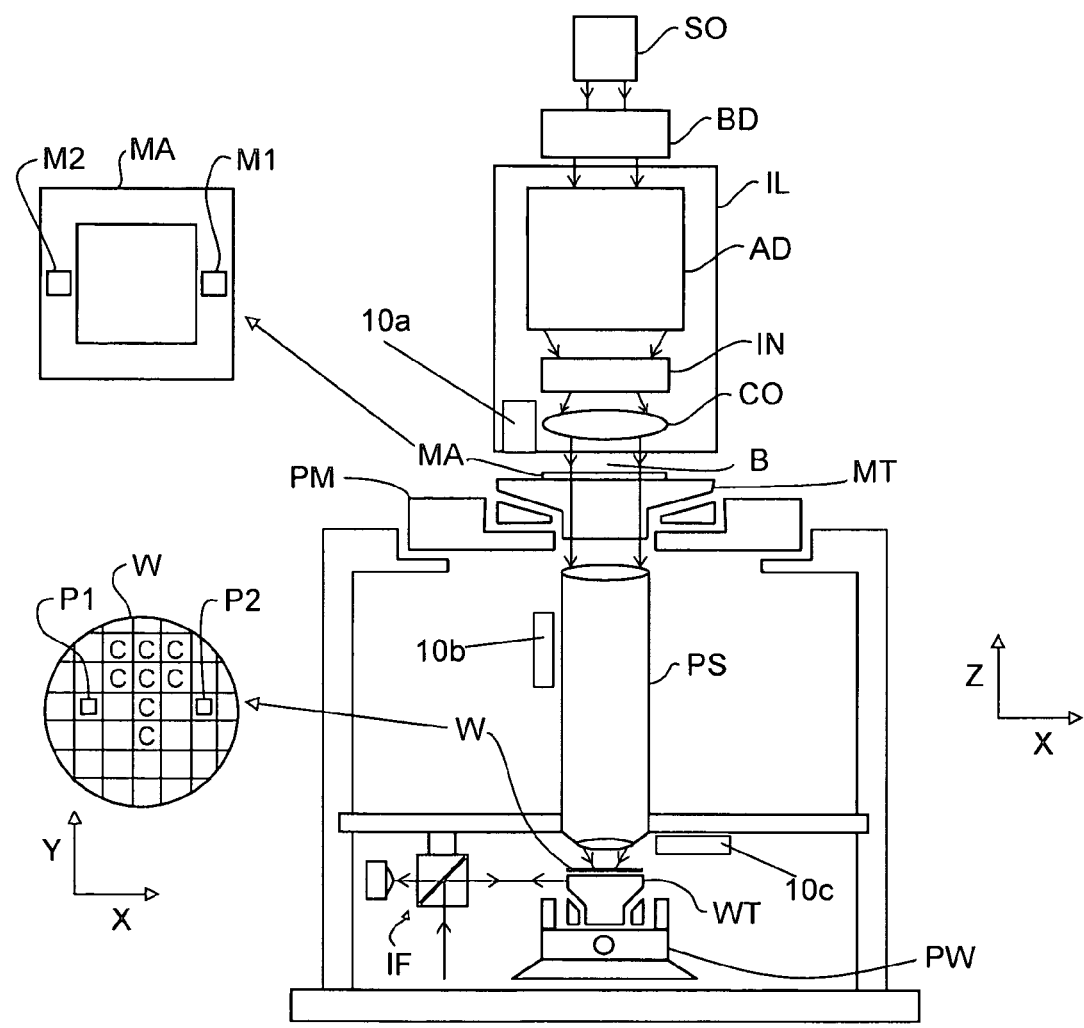
FIG. 1 depicts a lithographic apparatus according to an embodiment of the invention.

FIG. 1 schematically depicts a lithographic apparatus according to one embodiment of the invention. The apparatus can be arranged to transfer a pattern from a patterning device onto a substrate, as is explained in the following.

The apparatus comprises: an illumination system (illuminator) IL configured to condition a radiation beam B (e.g. UV radiation or other radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the effective numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIGS. 1-8 schematically depict the details and application of several cleaning apparatus 10. For example, in an embodiment, a lithographic apparatus can comprise one or more cleaning devices (or apparatus or assemblies or systems) 10 to clean one or more parts or surfaces of, or in the apparatus. In FIG. 1, such cleaning devices are schematically depicted with rectangles having reference numerals 10a, 10b, 10c. For example, the apparatus can comprise one or more cleaning devices 10a to clean at least part of a surface of a patterning device (reticle, mask) MA. Also, the apparatus can comprise one or more cleaning devices 10b to clean at least part of a projection system PS of the apparatus, for example at least part of a surface of a lens or mirror, depending on the type of projection system applied. Moreover, as an example, the apparatus can be provided with one or more cleaning devices 10c to clean at least part of a surface of a substrate W and/or substrate support WT. Also, one or more cleaning devices 10 can be provided to clean different parts of the apparatus, for example for cleaning surfaces of an illumination system IL, adjuster AD, integrator IN, condenser CO, a radiation collector, a foil trap, and/or other parts or areas of the apparatus.

In a further embodiment, at least one of the cleaning devices 10 of the apparatus is arranged to liberate, trap, capture or otherwise manipulate contamination, particularly for cleaning a surface, using at least one optical trap. For example, the cleaning device 10 can comprise at least one optical trap generator configured to generate at least one optical trap for trapping particles in the lithographic apparatus. Non-limiting examples for such cleaning devices are depicted in FIGS. 2-8.

Also, for example, at least one of the cleaning devices 10 can comprise, or be provided by or in, a respective assembly for cleaning a surface, the assembly comprising: at least one contaminant liberating device, which can be constructed and arranged to use electromagnetic fields, to (at least partly) liberate contaminants from the surface to be cleaned; and at least one particle trapping apparatus being configured to generate at least one optical trap.

Figure 2:
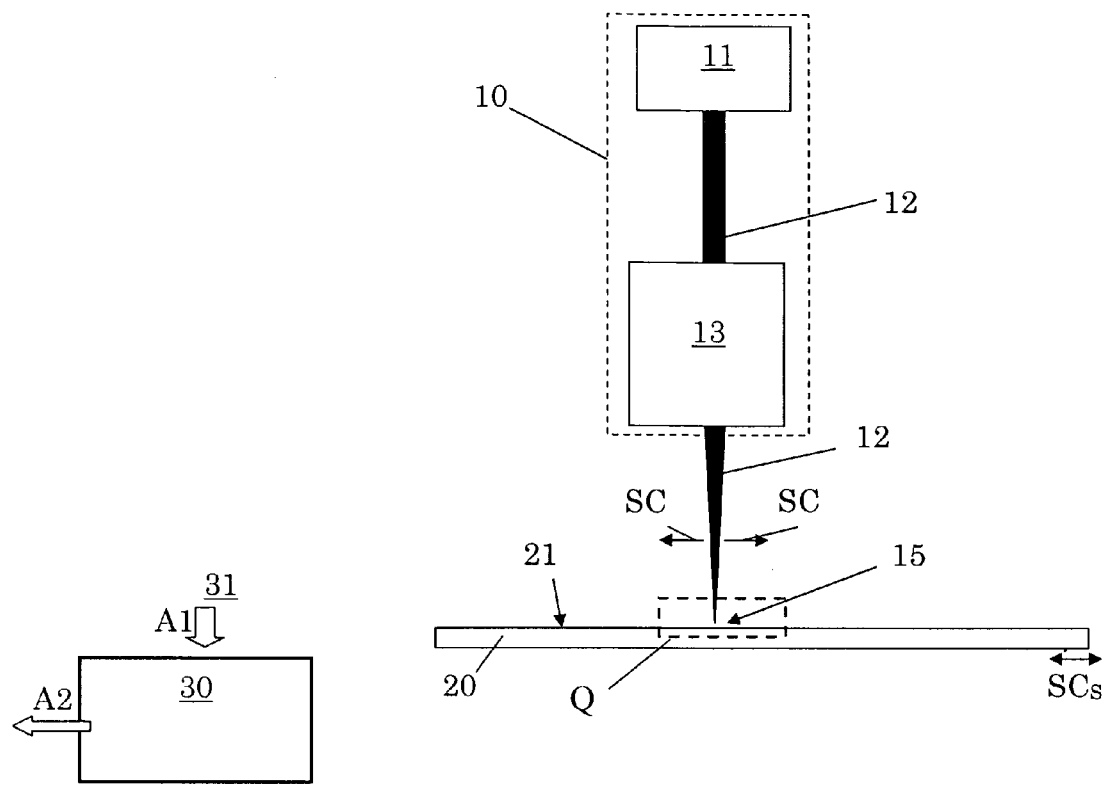
FIG. 2 depicts a non-limiting embodiment of the invention, in a side view.
Figure 3:
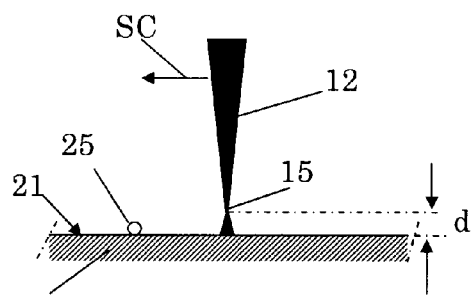
FIG. 3 depicts a detail Q of the embodiment shown in FIG. 2, wherein the optical trap is in a first position.
Figure 4:
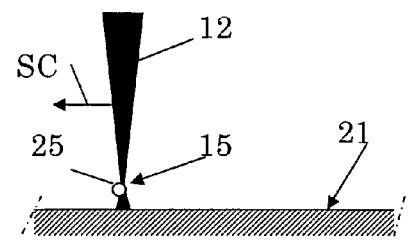
FIG. 4 is similar to FIG. 3, and shows the optical trap is in a second position.
Figure 5:
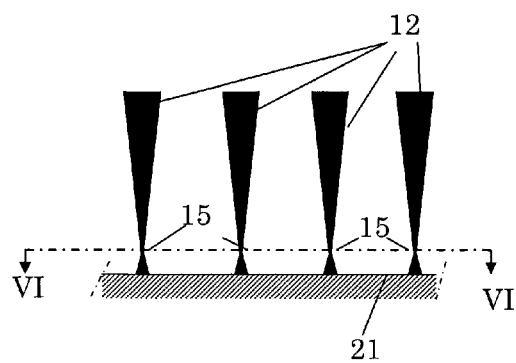
FIG. 5 is a similar detail as FIG. 3, of an alternative embodiment.
Figure 7:
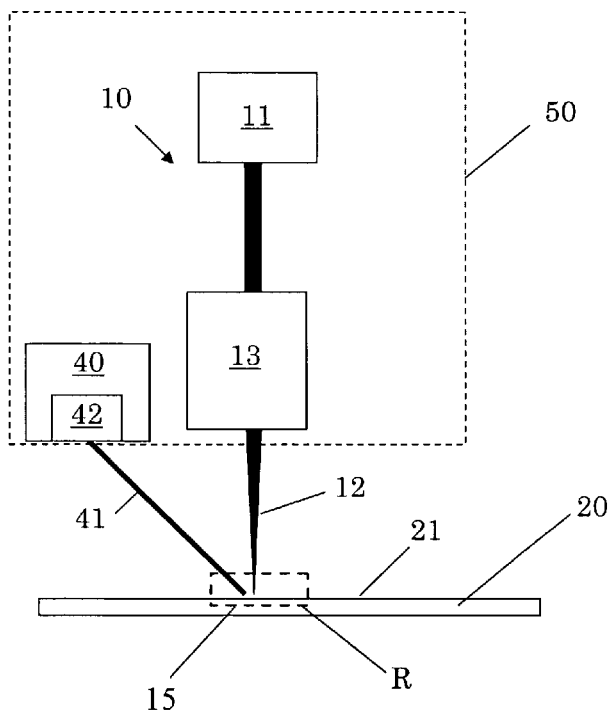
FIG. 7 depicts a non-limiting alternative embodiment.
Figure 8:
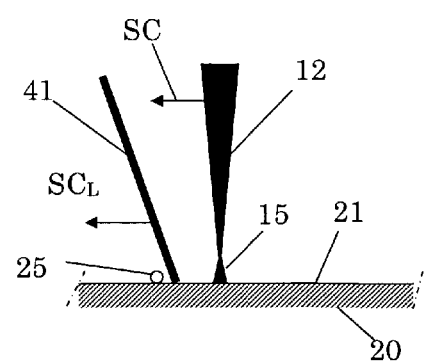
FIG. 8 is a detail R of FIG. 7.

In the embodiment of FIGS. 2-4, one or more optical traps 15 can be used to liberate particles, and to capture and/or remove particles. A non-limiting example of a cleaning system/assembly 50 which comprises the use of one or more optical traps in combination with a separate contaminant liberation is depicted in FIGS. 7-8

Optical traps as such are known to the skilled person, and will therefore not be described in detail in the present application. Some examples of devices configured to generate optical traps are optical tweezers and optical spanners. For example, an overview of the history, known applications of optical traps and known devices to create such traps can be found in the publications "Optical micromanipulation takes hold", by Kishan Dolakia and Peter Reece, Nanotoday, February 2006, Vol. 1, nr 1 (Elsevier), and "Lights, action: optical tweezers" by Justin E. Molloy and Miles J. Padgett, Contemporary Physics 2002, Vol. 43, nr. 4, pages 241-258 (Taylor & Francis Ltd), both of which are hereby incorporated herein by reference in their entireties.

Optical traps have been mainly applied to manipulate biological material, see for example US2002/0115164A1 (Wang et al.). Also, it has been shown experimentally that particles can be trapped at a beam waist of Laguerre-Gauss (LG) beams by the transfer of Orbital Angular Momentum to the particle(s), see e.g. K. Dholakia, et. al., "Optical tweezers: the next generation", Physics World, 15, 31 (2002), and J. E. Molloy and M. Padgett, "Lights, action: optical tweezers", Contemp. Phys. 43, 241 (2002), both of which are hereby incorporated herein by reference in their entireties.

Manipulation of micron-sized silica particles and biological specimens is now routine, see W. M. Lee, et. al., "Optical steering of high and low index microparticles by manipulating an off-axis optical vortex", J. Opt. A: Pure Appl. Opt. 7, 1 (2005), which is hereby incorporated herein by reference in its entirety. The "diffraction-free" properties of Bessel beam have been used to trap a multitude of particles in the main lobe and in the many side lobes, see D. McGloin and K. Dholakia, "Bessel beams: diffraction in a new light", Contemporary Physics, 46, 15 (2005), and V. Garces-Chavez, et. al., "Optical leviation in a Bessel light beam", Appl. Phys. Lett., 85, 4001 (2004), and K. Volke-Sepulveda, et. al., "Orbital angular momentum of a high-order Bessel light beam", J. Opt. B: Quantum Semiclass. Opt. 4, S82 (2002), all of which are hereby incorporated herein by reference in their entireties. Further, it is known to multiplex such beam modes for mass transport of objects in 2D and 3D, see for example U.S. Pat. No. 6,858,833 B1 (Curtis et al.). A basic idea of the present invention is to apply one or more of such optical traps in the field of contamination removal, and/or for example in lithography.

The application of optical traps to trap contamination provides many advantages over prior art contamination removal methods. For example, in an embodiment, in a surface cleaning method, at least one optical trap 15 can be moved along the surface to liberate and/or capture one or more contaminant particles that may be present on or near the surface, without having obtained and/or obtaining positional coordinates of such particles prior to encountering respective particles. For example, one or a plurality of optical traps 15 can be scanned along the surface for liberating, dislodging and/or capturing or trapping particles 25, and for example further manipulating or (re)moving trapped particles 25, as will be explained below. This development can provide a clean and efficient, 'non-contact', particle removal method using novel optical methods, for example by generating multiplexed Laguerre-Gauss (LG) and Bessel beam traps without the need for initial detection of the particles. Also, embodiments of the present invention include the providing of particle removal methods and apparatus, wherein particles can be removed safely from a surface, particularly without harming or otherwise impairing the surface. For example, in case the object 20 to be cleaned is a substrate W, the application of the optical trap 15 can avoid undesired disturbances of the substrate's surface 21. In case the object to be cleaned is an optical element, for example a lens, mirror, filter element, reticle, or other optical element, at least part of the surface 21 can be cleaned by the optical trap without impairing desired optical properties of the surface.

FIGS. 2-4 show an embodiment of a cleaning device or apparatus 10, that can, for example, be applied as at least one of the cleaning devices 10a, 10b, 10c of the embodiment of FIG. 1. The cleaning apparatus 10 is configured for cleaning at least part of a surface 21 of an object 20, for example a surface 21 of a substrate, a reticle, an optical element, and/or a part of a lithographic apparatus. The surface 21 to be cleaned can have various shapes and forms, as will be clear to the skilled person, for example a substantially flat surface, a profiled surface or a surface having a certain relief, and/or other surface types. The cleaning apparatus 10 is configured to generate at least one optical trap 15, and to move the at least one optical trap 15 along the surface 21 to liberate and/or capture one or more contaminant particles 25 that may be present on the surface 21, particularly without obtaining positional coordinates of such particles 25 prior to liberating and/or capturing respective particles. This is shown in FIGS. 2-4.

The cleaning device or apparatus 10 can be configured in many different ways for generating the at least one optical trap 15, as will be clear and is known to the skilled person. For example, the apparatus 10 can be a an optical tweezer and/or an optical spanner, known as such by the skilled person. The cleaning device 10 can be called a contaminant removal device, or particle trapping apparatus, constructed and arranged to capture contaminants 15, and/or a contaminant liberating device For example, in the embodiment of FIGS. 2-4, the cleaning apparatus 10 can be arranged to highly focus at least one beam of laser radiation 12 to a diffraction-limited spot, on or near the surface 21 to be cleaned, to provide at least one optical trap 15 on or near that surface 21. In an embodiment, the cleaning apparatus 10 can be provided with a laser 11 to produce the laser beam 12, and a beam controller and/or modifier 13, comprising a focusing device, for example, an optical system, lens or lens system or a microscope objective (of high numerical aperture), to highly focus the laser beam 12 to form the optical trap at or near the surface 21 (see the detail of FIG. 3). For example, the optical trap 15 is provided by an optical gradient field, resulting from the highly focused laser beam 12 or, in a further embodiment, from a focused beam of one or more LG modes to impart orbital angular momentum to the particle (see below). As is known to the skilled person, the optical gradient field can lead to a radiation pressure, or optical gradient force, particularly acting in/on dielectric particle material, which pressure or force can trap the particle 25. For example, the highly focused laser beam 12 can have a beam width of about 10 µm or less, or 2 µm or less, in the focal plane (at or near the surface 21), for example about 1 µm. Also, for example, the highly focused laser beam 12 can have a beam width of at least the size (diameter or average size) of a particle 25 to be manipulated thereby. In a non-limiting example, the laser beam 12 can have a beam width in the range of about 2 to 4 times the size (diameter or average size) of a particle 25 to be manipulated thereby.

In a further embodiment, the cleaning device 10 can include or be incorporated in a cleaning head which is mounted so as to be retractable from an operative position, at which a respective laser beam 12 can be directed onto the surface 21 of the object 20 to be cleaned, to a non-operative position at which it is out of the way and does, for example, not obstruct any other parts of a respective lithographic apparatus used during an exposure.

The laser radiation may have various wavelengths, for example in the visible wavelength range, ultraviolet wavelengths, infrared wavelengths or other wavelength regions. The beam 12 can be such, that the optical trap 15 is formed at the focusing point of the beam 12, such that the radiation can interact with a contaminant particle 25 to be liberated and/or trapped, to liberate and/or capture that particle.

Also, for example, in an embodiment, the cleaning device (or contaminant removal device, or liberating device) 10 can be configured to generate a so called Bessel beam or Laguerre-Gauss beam, or other suitable beam modes which can possess orbital angular momentum (OAM), wherein orbital angular momentum can be transferred from the optical beam 12 to the contaminant particle(s). For example, such beams can make a particle spin and gyrate, which can enhance removal of the particle 25 from the surface 21. Arrangements to provide such optical beam modes are known to the skilled person (see above-mentioned literature). As an example, optical beams 12 having orbital angular momentum can be generated holographically, and/or utilizing a suitable beam mode converter, a suitable phase plate, such as a suitable spiral phase plate, and/or other suitable means. As an example, in FIG. 2, the beam controller and/or modifier 13 can be configured to change the mode of incoming laser radiation of the laser beam 12 into a mode having a desired orbital angular momentum, to provide an optical trap 15 which can interact with a particle 25 to liberate the particle 25 via rotation or spinning of the particle 25. In that case, the cleaning device 10 can operate as a contaminant liberating device, which can liberate particles 25 from the surface to be cleaned, by spinning or twisting the particles 25 via the optical trap(s) 15. Also, in a non-limiting example, a contaminant liberation may be performed by having an additional laser pulse propagating with the trapping beam to thermally agitate the adhered particle, for example to weaken a van der Waals interaction, which might be present in case of--for example--a silica particle on a dielectric or metallic surface and/or other contaminants and surfaces (see also below).

In an embodiment, the cleaning apparatus 10 can also be configured to move the at least one optical trap 15 along the surface 21, such that the at least one optical trap 15 (one in FIGS. 2-4) reaches substantially each part of the surface 21 within a certain cleaning period, and such that the at least one trap 15 can encounter and liberate and/or capture one or more contaminant particles 25 that may be present on the surface 21. In this way, substantially each part of the surface 21, preferably the overall surface 21, can be cleaned in an efficient manner.

For example, in an embodiment, the surface 21 can be moved with respect to the trapping apparatus 10. Also, for example, the trapping apparatus 10 can be moved with respect to the surface 21. Moreover, as is depicted in FIG. 2, the trapping apparatus can be configured to modify the direction of the outgoing optical trapping beam 12, to scan the focusing area (which provides the optical trap 15) over the surface 21. The beam controller and/or modifier 13 can be configured to provide such a beam steering, for example utilizing suitable optics such as one or more adjustable or movable beam steering mirrors (not shown) which can be located in the path of the optical beam 12.

During use of the embodiment of FIGS. 2-4, the surface 21, or part thereof, can be cleaned, wherein the cleaning apparatus 10, 11, 13 produces the optical trap 15 at or just above the surface 21. Herein, the laser 11 can provide a suitable laser beam 12 and the beam controller and/or modifier 13 can control and/or modify the laser beam 12 to provide the conditions which generate the optical trap 15 at a desired location, at or near the surface 21.

Preferably, the optical trap 15 and surface 21 are moved with respect to each other, such that the trap 15 can scan the surface to liberate and/or capture a particle 25 that may be present on the surface 21. Scanning directions, wherein the optical trap 15 is moved along the surface 21, or with respect to the surface, are indicated by arrows SC in the drawings, and an equivalent optional movement of the surface 21 with respect to the cleaning apparatus 10 is indicated by double arrow $SC_S$. In this way, one or more contaminant particles 25 can be liberated and/or trapped without previously knowing exact positional coordinates of such particles 25 on the surface 21.

Also, as follows from above, the generated optical trap 15 can be suitable to transfer orbital angular momentum to particles 25, present on the surface 21, which is particularly useful to enhance liberation (for example desorption) of particles 25 from the surface 21. Thus, particles can be efficiently liberated, for example to be removed by the optical trap 15 as well, or to be removed in a different manner, such as by a suitable fluid flow applied to the surface, or by applying a suitable fluid of a monolayer in thickness to weaken, for example, any van der Waals bonds.

In FIG. 3, a particle 25 is present on the surface 21. Preferably, the position of he particle is not known by the cleaning apparatus 10. However, the cleaning apparatus does scan the optical trap 15 over the surface 21, towards the particle 25, for example by chance. Thus, the optical trap 15 can encounter the particle 25, to interact with the particle, trap the particle and remove the particle 25 from the surface 21, as is depicted in FIG. 4. Herein, particle removal can comprise a lifting of the particle 25 from the surface 21 (in a direction perpendicular to the surface), and/or a moving of the particle 25 with respect to the surface 21, for example along the surface 21. Also, preferably, the optical trap can transfer orbital angular momentum to the particle, to assist the removal of the particle 25 from the surface 21. In addition, Bessel beams are known to be able to capture particles laterally away from the beam eei4ie center.

In FIG. 3, a particle 25 is present on the surface 21. Preferably, the position of the particle is not known by the cleaning apparatus 10. However, the cleaning apparatus does scan the optical trap 15 over the surface 21, towards the particle 25, for example by chance. Thus, the optical trap 15 can encounter the particle 25, to interact with the particle, trap the particle and remove the particle 25 from the surface 21, as is depicted in FIG. 4. Herein, particle removal can comprise a lifting of the particle 25 from the surface 21 (in a direction erpendicular to the surface), and/or a moving of the particle 25 with respect to the surface 21, for example along the surface 21. Also, preferably, the optical trap can transfer orbital ngular momentum to the particle, to assist the removal of the particle 25 from the surface 21. In addition, Bessel beams are known to be able to capture particles laterally away from the beam center.

Also, as an example, during use, a distance d between a center of the optical trap 15 and the surface can be held at about the same value as an average radius or other dimension of a particle 25 to be trapped. Also, other distances d between a trap center and the surface 21 can be applied, dependent on size and type of particle(s) to be removed, and the size of the optical trap, as will be clear to the skilled person. In an embodiment, the distance d between a center of the optical trap 15 and the surface 21 may be varied, for example by the beam controller and/or modifier 13 or by varying the distance between that surface 21 and the cleaning apparatus 10. For example, one or more small variations in the distance d can be useful in an initial removal or detraction or pickup of a particle 25, present at the surface 21. As a non-limiting example, a change in the distance d between the trap center and the surface 21 can be of about the same scale as the dimensions of the particle 25, such as a particle diameter, or particle height measured perpendicularly with respect to the surface 21.

The cleaning device 10 can also be configured to move the optical trap(s) 15 to an area away from the surface 21 to be cleaned, for example after one or more scanning or 'hoovering' runs of scanning the trap 15 over or along the surface 21, for example to a particle removal area 31 (see FIG. 2). For example, the particle removal area 31 may be movable towards the optical trap 15 to receive captured particles, for example in case the surface 21 to be cleaned is being moved with respect to the cleaning device 10 (as by directions $SC_S$). As an example, the cleaning device 10 can manipulate each optical trap 15, move the trap 15 through a particle capturing area, and/or 'open' or undo the optical trap 15, to release or transfer any particles 25 that may have been captured in the trap 15. A particle removal area 31 can be configured to receive such particles 25 from the optical trap(s) 15, capture and hold such particles 25, and/or further remove such particles. As a non-limiting example, in FIG. 2, a pumping apparatus or suction line 30 has been provided at the particle removal area 31, to receive particles from the one or more optical traps 15, after a mentioned surface scanning, to pump or suck such particles 25 away from the particle removal area 31 (which is indicated by an arrow A1), and for example optionally to further remove such particles (which is indicated by an arrow A2). Such particle capturing zones 31 and particle removal apparatus 30 can be configured in various ways, as will be clear to the skilled person.

Figure 6:
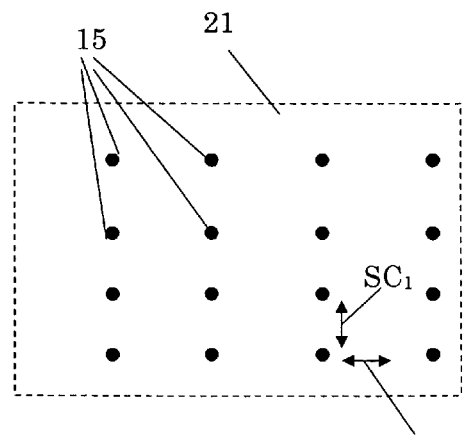
FIG. 6 is a cross-sectional view over line VI-VI of FIG. 5.

As is mentioned above, in an embodiment, more than one optical trap 25 can be applied to clean a surface 21. This is schematically depicted in the embodiment shown in FIGs. 5-6. Particularly, the embodiment of FIGS. 5-6 differs from the embodiment shown in FIGS. 2-4 in that the cleaning device 10 provides a plurality of optical traps 15. For example, the cleaning device 10 can be configured to produce multiplexed beam traps, and preferably multiplexed Laguerre-Gauss or Bessel beam traps. Multiplexing of the traps is known to the skilled person. Multiplexing can be performed, using one or more laser beam sources. For example, multiplexed traps, or multiple optical traps (shown in FIG. 5) can be provided in a simple manner, by the application of interference of multiple coherent optical beams. Such multiple coherent optical beams can provide a very large number of trapping sites 15, for example at least 100 or at least 1000 trapping sites, in two or three dimensions. Also, holograms can be applied for forming multiple optical traps (see for example mentioned US. Pat. No. 6,858,833).For example, the multiplexing can be performed by holographic gratings, spatial light modulators, by micro phase plates on metallic or Si substrates, by multiple spiral phase plates, or multiplexed axicons. In this way, the surface 21 can be cleaned swiftly, wherein a relatively large number of optical traps 15 can reach various surface parts at the same time to liberate and/or capture contaminants. As is shown in FIG. 6, for example, various scanning directions $SC_1$, $SC_2$ can be applied, to scan the optical traps with respect to the surface 11, for example two orthogonal scanning directions $SC_1$, $SC_2$ or different directions.

FIGS. 7-8 shown an embodiment of an assembly 50, which differs from embodiments shown in FIGS. 2-6 in that a separate contaminant liberating device 40 is provided in addition to the contaminant trapping device 10. Herein, the contaminant liberating device 40 and contaminant trapping device 10 can be arranged in various ways, and can, for example, be integrated with each other, be separate entities, and/or be arranged differently. The assembly 50 is particularly constructed to liberate one or more particles without applying or using one or more optical traps 15 to that aim, wherein one or more optical traps 15 are still used to capture and/or remove (at least partly) liberated particles 25. Herein, the liberating of particles 25 can involve loosening bonds or other forces (for example adhesion forces, sorption forces) between particles and the surface 21, with or without (re)moving the particles 25 with respect to the surface 21. Thus, a liberated or at least partly liberated contaminant can still be present at or in contact with the surface to be cleaned. Also, a liberated particle can be removed from the surface, but still be located at a short distance from the surface. For example, as will be explained in the following, the contaminant liberating device 40 can be configured to generate one or more particle liberating beams 41 to liberate particles, and the trapping device 10 is configured to generate one or more separate trapping beams 12. However, the liberating device 40 can also be configured to liberate particles in a different manner from the surface 21, for example using different liberation techniques, such as applying electromagnetic (for example electric and/or magnetic) fields to the surface, depending on the type(s) of particles 25 to be liberated.

For example, the cleaning assembly 50 of FIGS. 7, 8 can comprise at least one contaminant liberating device 40 being configured to weaken bonds between the contaminants and the surface, as well as at least one mentioned particle trapping apparatus 10 being configured to generate at least one optical trap 15. As an example, again, the particle trapping apparatus 10 can be provided by an optical tweezer and/or an optical spanner. In addition, for example, the contaminant liberating device 40 can be configured to treat the surface 21 (and contaminants) by applying at least one of the following to the surface 21 and/or contaminants: a fluid, a liquid, a plasma, a cold plasma, an electromagnetic field, a radiation beam, a particle beam. For example, herein, a cold plasma treatment can provide a low-energy treatment, and a low damage method, wherein an (alternating current, AC) electromagnetic field and chemical interaction can be coupled or combined to weaken bonds between contaminants and the surface.

For example, the contaminant liberating device 40 can be configured to reduce or break a force between contaminant particles 25 and a surface 21 of the object 20 to be cleaned. In a further embodiment, the contaminant liberating device 40 can comprise a laser device 42 which directs a particle liberating laser beam 41 of radiation against the surface 21 of the object to be cleaned, preferably to at least one of ablate and thermally dislodge contaminants 25 thereon. Such laser devices 42 are known to the skilled person, and can be configured in various ways. Preferably, a particle liberation does not lead to damage of the respective contaminant particle. Thus, preferably, the laser cleaning intensity is below a damage threshold of contaminant particles to be treated thereby, and preferably such that the surface is not damaged by the laser. As an example, the contaminant liberating device 40 can comprise a dry laser cleaning device or a steam laser cleaning device. Laser cleaning is one particular method of surface cleaning that may be used to remove at least a portion of these transient particles. Such a laser cleaning, provided by the contaminant liberating device 40, can be based upon the static or zeta potential, also referred to as the interface energy or physical bond, between a particle and the surface 21 where the particle 25 is deposited. Interface energy is relative to the inverse of the ratio of the diameter of the particle and the contact diameter of the particle on a surface. Dry laser cleaning is one type of laser cleaning which may direct a beam of laser radiation toward the surface 21, which may be directed to a specific particle, for example. Laser steam cleaning is another method of cleaning the surface 21, by the liberating device 40, which may incorporate dry laser cleaning technology, but uses a liquid interface on the surface 21 to at least partially reduce the damage that may result from dry laser cleaning, and may additionally allow removal of particles without the need to dissipate the laser energy entirely into the particle. In a further embodiment, in this case, the trapping apparatus 10 can be configured to trap particles 25 that have been liberated from the surface by the (laser) liberating device 40, see FIG. 8.

For example, the contaminant liberating device 40 can be configured to direct the particle liberating beam 41 onto the surface 21 at a predetermined angle of incidence. Also, the contaminant liberating device 40 can comprise a beam scanning device constructed and arranged to vary the angle of the particle liberating beam to scan the surface to be cleaned. A moveable mirror or other steering device (not shown) can be provided, and can effect a rapid scan of the particle liberating beam 41 along the surface 21. The particle liberating beam 41 can be directed against the surface to be cleaned and can liberate contaminants therefrom by a combination of ablation, combustion and thermal effects. Contaminants can be mainly vaporized and combusted if any oxygen is present. The vaporized contaminants may assist in removing heavier contaminants that are not vaporized and may also be turned into a plasma by continued absorption of energy from the particle liberating beam 41. Inorganic contaminants, mainly particles, absorb energy from the laser beam 41 rapidly and the resulting thermal expansion causes a shockwave which dislodges the contaminant from the surface. The particles may also be subject to ablation and/or sublimation. To optimize the laser liberating process, the wavelength of the particle liberating beam 41 can be chosen for maximum absorption by the expected contaminants. Also, the laser device can be adapted to vary the wavelength of the laser beam 41. A pulsed particle liberating beam 41 can be particularly effective, especially with a short pulse length, e.g. less than 100 nanoseconds and preferably less than 10 nanoseconds. With a pulsed source, the thermal shockwave effect is pronounced. Also, subsequent pulses impinging on vaporized or dislodged contaminants may generate a plasma and further shock waves, which assist in dislodging contaminants. A Q-switched laser 42 can be used to provide high power short laser pulses. Also, for protection of delicate films on the object 20 to be cleaned, a polarized laser beam 41 with the plane of polarization lying in the plane of incidence may be used. The particle liberating beam 41 is then directed onto the surface to be cleaned at an angle of incidence less than Brewster's angle for the surface and/or films in question. In this way absorption of the particle liberating beam 41 in the surface 21 to be cleaned is minimized and hence also degradation of the surface 21 and any films thereon. The (particle liberating) laser beam 41 can be directed to a predetermined location of the surface 21 in various ways, as will be clear to the skilled person, for example by moving the surface 21, moving the laser source 42 and or by providing suitable laser beam steering. The contaminant liberating device 40 may be used to perform a complete sweep of areas of the component susceptible to contamination and where contamination is critical or may be coupled to a contamination detector and used to clean only those places where contamination is detected. In the latter case, a laser trigger can be coupled to a positioning device, via a suitable control system, so as to enable laser cleaning of only the required spots of the surface 21.

As is depicted in FIGS. 7-8, the assembly 50 can be configured to move the at least one optical trap 15 with respect to the surface 21 to be cleaned, to capture particles present at or near the surface 21. Herein, the contaminant liberating device 40 can be constructed and arranged to subsequently treat various parts of the object to be cleaned, to liberate contaminants from those parts, as is described above. The trapping device 10 can be configured to move the at least one optical trap 15 with respect to the object to be cleaned (as in above-mentioned embodiments), the particle trapping apparatus being configured to move at least one optical trap to a part of the surface which part is to be, is and/or after that part has been treated by the contaminant liberating device 40.

During use of the embodiment of FIGS. 7-8, the contaminant liberating device 40 can be used to liberate contaminants 25 from the surface which is to be cleaned. For example, the contaminant liberating device 40 can treat one or more parts of the surface 21 to liberate contaminants. Herein, for example, the laser device 42 can scan the laser beam 41 in a predetermined way over the surface, or randomly, or in a different manner. Preferably, the particle liberating operating of the cleaning device is achieved without obtaining positional coordinates of such particles 25 prior to liberating respective particles. Alternatively, a particle detection device (not shown) can be provided, to detect particles 25 to be removed on the surface 21 to be cleaned, wherein the particle liberating operating of the cleaning device is achieved using positional coordinates of particles 25 detected by the particle detection device.

During use, the contaminant removal device 10 generates at least one optical trap 15 to trap contaminants, liberated by the liberating device (see FIG. 8). For example, prior to, during and/or after the laser device 42 has treated a surface part, the at least one optical trap 15 can be moved to or near the surface part that has been treated by the contaminant liberating device 40, to capture liberated contaminants.

The generation of the at least one optical trap can be the same or similar to the methods described above concerning the FIGS. 2-6 embodiments, using for example one or more laser beams 12. In one embodiment, the assembly 50 of FIG. 7 can include only one laser source to provide a primary laser beam, as well as a beam splitter to split the primary laser beam into one or more particle liberating beams 41, to be used to liberate particles, and one or more trapping beams 12, to be used to provide the optical trap(s) 15. In an other embodiment, separate laser sources are provided, to generate the beams 12, 41 separately.

For example, during use, the optical trap 15 can be located close to the surface section where the laser beam 41 of the liberating device 40 runs into the surface 21, or at a predetermined distance from that surface section. For example, a scanning direction SC of the particle trapping beam 12 generated by the trapping device 10 can be the same as a scanning direction $SC_L$ of the particle liberating beam 41 (see FIG. 8), and/or the particle trapping beam 12 can be directed to follow the particle liberating beam 41 (see FIG. 8). Movement of the particle trapping beam 12 with respect to (movement of) the particle liberating beam 41 can be also carried out in a different manner, for example using a certain (different) correlation between beam movements, angles of incidence, or other beam parameters. Operation of the trapping beam 12 does not have to be correlated with respect to operation of the particle liberating beam 41. For example, a surface 21 (or part thereof) can first be treated by the particle liberating beam 41, to loosen or liberate particles 25, after which one or more optical traps 25 are used to trap (and remove) the loosened and/or liberated particles 25. Also, as is mentioned above, the at least one optical trap 15 can be moved along the surface 21 to capture one or more liberated contaminant particles that may be present on or near the surface 21, in this case with and/or without obtaining positional coordinates of such particles 25 prior to capturing respective particles. Also, in an embodiment, the at least one optical trap 15 can be moved along the surface 21, such that the at least one optical trap 15 reaches substantially each part of the surface 21 within a certain cleaning period, and such that the at least one trap can encounter one or more contaminant particles that may be present on or near the surface 21. Also, in the present embodiment, the at least one optical trap can be moved from at least a first position (such as near the surface 21 to be cleaned) to a second position (for example a mentioned removal area A1), to transport particles trapped by the trap and/or to move particles away from the surface 21.

In an embodiment, there is provided a device manufacturing method, for example a lithographic method, the method comprising transferring a pattern from a patterning device onto a substrate (see for example FIG. 1). The method can also include generating at least one optical trap 15 to optically trap particles, for example such as or similar to particle trapping as described above and/or depicted in FIGS. 1-8. For example, the method can comprise: moving the optical trap 15 to move optically trapped particles. In further embodiments, particles 25, to be optically trapped, can be located on or near a patterning device MA, and/or on or near the substrate W, and wherein the at least one optical trap is generated on or near the patterning device MA, and/or on or near the substrate W, respectively, for trapping particles 25. In a further embodiment, the method can comprise: projecting a patterned radiation beam onto the substrate, utilizing a projection system (see for example FIG. 1), wherein the particles, to be optically trapped, can be located on or near at least a part of the projection system PL, and wherein the at least one optical trap 15 is generated on or near the respective projection system part for trapping particles.

For example, contamination, to be removed, can comprise various types of contaminant particles 25, which can have various sizes and shapes, and can comprise or consist of various materials. As an example, in lithography, the contamination can include dielectric particles, metal particles, inorganic contaminants on a mask, particulates on a substrate table, resist debris sputtered from a substrate by the projection beam during exposures, and mechanical contact between moving parts of the apparatus which may cause particulates to be dislodged from the contacting surfaces, and/or other contamination. Cleaning methods and devices, described above, can provide a desired reduction of lithography errors caused by contamination in a time efficient manner.

As follows from above, new developments in the understanding of the fundamental physical properties of radiation beams have led to efficient optical trapping methods such as "optical tweezers" and "optical spanners" based on the Laguerre-Gauss (LG) modes of radiation beams and the peculiar "propagation invariant" properties of the so-called Bessel beams. It has been shown by a multitude of research groups (see above) that particles several microns in diameter, and large biomolecules such as chromosomes, may be trapped near the focal region (the beam waist) and accurately micromanipulated. As follows from above, others have shown that by using spatial light modulators or holographic gratings, radiation beams with properties necessary for trapping may be multiplexed in two or even three dimensions. As follows from above, and for example from FIGS. 1-8, the optical trapping technique is advantageous for particle removal in lithographic components and systems, and or in other fields.

For example, in an embodiment, the optical field of Bessel beams and the OAM of LG modes can be used to trap particles 25. Such beams can provide relatively high particle liberating and/or trapping forces. Highly multiplexed versions of these beams can be used to trap and remove multiple particles 25 from each beam waist, like multiple optical tweezers. Multiplexing can be performed by holographic gratings, spatial light modulators, by micro phase plates on metallic or Si substrates, multiple spiral phase plates, and/or multiplexed axicons, or in a different manner. A torque associated with OAM transfer can be used to remove dielectric and metallic particles deposited on surfaces 21, e.g. surfaces of Si wafers, reticles, optics. These particles 25 may be contacted to the surface 21 by the van der Waals interaction and removed by an "optical spanner" action. An embodiment applying the multiplexing can allow the removal of particles 25 in the range from a few nanometers to a few microns in size, without having to know the location of the particle(s) 25. As the part to be cleaned moves through the laser fields, the particles are captured (see for example FIGS. 3-8).

Contamination on a surface 21 of a component may be detected and/or cleaned, for example, during the production cycle of a lithographic projection apparatus. For example, a substrate table may be cleaned, using at least one optical trap 15, in between unloading of a substrate from and loading of another substrate onto the substrate table when contamination present on a support surface of the substrate table is detected. Similarly, the cleaning and/or detecting of contamination may be effected during preparation of a component. For example, the cleaning and/or detecting may be performed during an alignment process such as at an exposure position or at an alignment position, such as in a pre-aligner or a separate alignment station.

The invention is not limited to lithography or lithographic appliances as such. Many different objects and/or surfaces can be cleaned using the teachings of the invention. For example, the invention can be applied in a repair process, for example in a method to repair or reconstruct an optical element, for example a reticle, or a method to repair a surface of a substrate, for example a semiconductor substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, electron beam based methods, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Also, for example, a liberation of a particle can involve a partial liberation. Particle liberation on can involve a weakening of a bond between a contaminant particle and a surface to be cleaned.

The descriptions above are intended to be illustrative, not limiting. Thus, it will be apparent to one skilled in the art that modifications may be made to the invention as described without departing from the scope of the claims set out below.

What is claimed is:

1. A method to clean a surface, the method comprising:
    at least partly liberating contaminants from the surface with a contaminant liberating device;
    capturing the contaminants that have been at least partly liberated with a contaminant removal device, the contaminant removal device generating an optical trap to trap the contaminants that have been at least partly liberated; and
    moving the optical trap along the surface, without having obtained and/or obtaining positional coordinates of the contaminants on the surface.

2. A method according to claim 1, wherein the contaminant liberating device is configured to treat the surface and the contaminants by applying to the surface and contaminants at least one selected from the group comprising: a fluid, a liquid, a plasma, an electromagnetic field, a radiation beam, and a particle beam.

3. A method according to claim 1, wherein the contaminant liberating device comprises a laser device that directs a particle liberating beam of radiation against the surface to be cleaned to at least ablate and/or thermally dislodge contaminants thereon.

4. A method according to claim 1, wherein the optical trap is generated by an optical tweezer and/or an optical spanner.

5. A method according to claim 1, wherein the contaminant removal device generates at least one focused beam of laser radiation to provide the optical trap.

6. A method according to claim 1, wherein the contaminant liberating device and/or the contaminant removal device is configured to transfer orbital angular momentum to the contaminants.

7. A method according to claim 1, wherein the contaminant liberating device and the contaminant removal device are provided by the same cleaning device, the cleaning device being configured to generate at least one optical trap to transfer orbital angular momentum to at least one contaminant and to capture at least one contaminant.

8. A method according to claim 1, wherein the optical trap is moved along the surface such that the optical trap reaches substantially each part of the surface within a certain cleaning period, and such that the optical trap can encounter one or more contaminant particles that may be present on or near the surface.

9. A method according to claim 1, wherein the contaminant liberating device treats one or more parts of the surface to at least partly liberate contaminants, and wherein the optical trap is moved to or near each surface part that has been treated by the contaminant liberating device to capture the at least partly liberated contaminants.

10. A method according to claim 1, wherein the optical trap is moved from at least a first position to a second position to transport particles trapped by the trap and/or to move particles away from the surface.

11. A method according to claim 1, wherein the contaminant removal device generates a plurality of optical traps, and further comprising moving at least one of the optical traps along the surface, without having obtained and/or obtaining positional coordinates of the contaminants on the surface.

12. A method to clean a surface, the method comprising:
    moving an optical trap along the surface to at least partly liberate and/or capture contaminant particles without knowing positional coordinates of such particles.

13. A method according to claim 12, further comprising moving at least one of a plurality of optical traps along the surface, without having obtained and/or obtaining positional coordinates of the contaminants on the surface.

14. A device manufacturing method, comprising:
    transferring a pattern from a patterning device onto a substrate;
    generating an optical trap to optically liberate, trap and/or capture particles from a surface; and
    moving the optical trap along the surface, without having obtained and/or obtaining positional coordinates of the particles on the surface.

15. A method according to claim 14, wherein the particles are located on or near the patterning device, and/or on or near the substrate, and wherein the optical trap is generated on or near the patterning device, and/or on or near the substrate, respectively.

16. A method according to claim 14, further comprising:
    projecting a patterned radiation beam onto the substrate with a projection system, wherein the particles are located on or near at least a part of the projection system, and wherein the optical trap is generated on or near the projection system part.

17. A method according to claim 14, further comprising generating a plurality of optical traps to optically liberate, trap and/or capture particles from a surface; and
    moving at least one of the plurality of optical trap along the surface, without having obtained and/or obtaining positional coordinates of the contaminant particles on the surface.

18. A method to clean a surface of an optical element, the method comprising:
    at least partly liberating and/or capturing contaminant particles, present on the surface of the optical element with an optical trap; and
    moving the optical trap along the surface, without having obtained and/or obtaining positional coordinates of the contaminant particles on the surface.

19. A method according to claim 18, wherein the optical element is selected from the group comprising: a lens, a mirror element, a reticle, an illumination system, an adjuster, an integrator, a condenser, a radiation collector, a foil trap, and an optical filter.

20. A method according to claim 18, further comprising
at least partly liberating and/or capturing contaminant particles, present on the surface of the optical element with a plurality of optical traps; and
moving at least one of the plurality of optical traps along the surface, without having obtained and/or obtaining positional coordinates of the contaminant particles on the surface.

21. An assembly for cleaning a surface, the assembly comprising:
a contaminant liberating device constructed and arranged to at least partly liberate contaminants from the surface to be cleaned; and
a particle trapping apparatus configured to generate an optical trap,
wherein the optical trap is configured to be moved along the surface, without having obtained and/or obtaining positional coordinates of the contaminants on the surface.

22. An assembly according to claim 21, wherein the trapping apparatus is configured to trap particles that have been at least partly liberated from the surface by the liberating device.

23. An assembly according to claim 21, wherein the contaminant liberating device is configured to reduce or break a force between contaminant particles and the surface of the optical element, and/or to ablate and thermally dislodge contaminants from the surface, using electromagnetic fields.

24. An assembly according to claim 21, wherein the contaminant liberating device comprises a dry laser cleaning device or a steam laser cleaning device.

25. An assembly according to claim 21, wherein the assembly is configured to move the optical trap, or the surface to be cleaned, or both, with respect to each other.

26. An assembly according to claim 21, wherein the contaminant liberating device is constructed and arranged to subsequently treat various parts of the surface to at least partly liberate contaminants from those parts, and wherein the particle trapping apparatus is configured to move the optical trap to at least one part of the surface which is to be, is, and/or has been treated by the contaminant liberating device.

27. An assembly according to claim 21, wherein the optical trap is generated by an optical tweezer and/or an optical spanner.

28. An assembly according to claim 21, wherein the particle trapping apparatus is arranged to focus at least one beam of laser radiation on or near the surface to be cleaned, to provide the optical trap on or near that surface.

29. A lithographic apparatus arranged to transfer a pattern from a patterning device onto a substrate, the apparatus comprising at least one assembly according to claim 21.

30. An assembly according to claim 21, wherein the particle trapping apparatus is configured to generate a plurality of optical traps configured to be moved along the surface without having obtained and/or obtaining positional coordinates of the contaminants on the surface.

31. A cleaning apparatus for cleaning a surface, the apparatus being configured to generate an optical trap, and to move the ene optical trap, or the surface, or both, with respect to each other, to at least partly liberate and/or capture one or more contaminant particles that are present on the surface, without having obtained and/or obtaining positional coordinates of such particles prior to liberating and/or capture of such particles.

32. A cleaning apparatus according to claim 31, wherein the cleaning apparatus is configured to generate a plurality of optical traps, and to move at least one of the plurality of optical traps, or the surface, or both, with respect to each other, to at least partly liberate and/or capture one or more contaminant particles that are present on the surface, without having obtained and/or obtaining positional coordinates of such particles prior to liberating and/or capture of such particles.

33. A cleaning apparatus for cleaning a surface, the apparatus being configured to generate an optical trap, and to move the optical trap along the surface, such that the optical trap reaches substantially each part of the surface within a certain cleaning period, and such that the optical trap can encounter one or more contaminant particles that are present on the surface, without having obtained and/or obtaining positional coordinates of such particles prior to liberating and/or capture of such particles.

34. A cleaning apparatus according to claim 33, wherein the cleaning apparatus is configured to generate a plurality of optical traps, and to move at least one of the plurality of optical traps along the surface, such that the optical trap reaches substantially each part of the surface within a certain cleaning period, and such that the optical trap can encounter one or more contaminant particles that are present on the surface, without having obtained and/or obtaining positional coordinates of such particles prior to liberating and/or capture of such particles.

35. An assembly comprising at least an optical element, as well as a particle trapping apparatus being configured to generate an optical trap, the assembly being configured such that the particle trapping apparatus can clean at least part of the optical element using the optical trap, without having obtained and/or obtaining positional coordinates of contaminants prior to liberating and/or capture of such contaminants.

36. An assembly according to claim 35, wherein the particle trapping apparatus is configured to generate a plurality of optical traps, and wherein the assembly is configured such that the particle trapping apparatus can clean at least part of the optical element using at least one of the plurality of the optical traps, without having obtained and/or obtaining positional coordinates of contaminants prior to liberating and/or capture of such contaminants.

37. A lithographic apparatus arranged to transfer a pattern from a patterning device onto a substrate, the apparatus comprising an optical trap generator configured to generate an optical trap to liberate and/or capture particles in the lithographic apparatus, without having obtained and/or obtaining positional coordinates of such particles prior to liberating and/or capture of such particles.

38. A lithographic apparatus according to claim 37, wherein the optical trap generator is configured to generate a plurality of optical traps to liberate and/or capture particles in the lithographic apparatus, without having obtained and/or obtaining positional coordinates of such particles prior to liberating and/or capture of such particles.

* * * * *

UNITED STATES PATENT AND TRADEMARK OFFICE
CERTIFICATE OF CORRECTION

PATENT NO. : 7,628,865 B2 Page 1 of 1
APPLICATION NO. : 11/413216
DATED : December 8, 2009
INVENTOR(S) : Mandeep Singh It is certified that error appears in the above-identified patent and that said Letters Patent is hereby corrected as shown below:

Column 19, Claim 31, line 58, please delete "ene".

Signed and Sealed this

Ninth Day of March, 2010

David J. Kappos
*Director of the United States Patent and Trademark Office*